United States Patent [19]
Robinson

[11] Patent Number: 5,912,434
[45] Date of Patent: Jun. 15, 1999

[54] KENNY CLAMP

[76] Inventor: Wayne H. Robinson, 671 Teton Dr., Lothian, Md. 20711

[21] Appl. No.: 08/939,658

[22] Filed: Sep. 29, 1997

[51] Int. Cl.$^6$ .............................. H02G 15/02; H02G 3/18
[52] U.S. Cl. .............................. 174/78; 174/51; 174/65 R
[58] Field of Search .................................. 174/78, 74 R, 174/65 R, 51, 151; 439/98, 99

[56]  References Cited

U.S. PATENT DOCUMENTS

| | | | |
|---|---|---|---|
| 2,704,357 | 3/1955 | Johnson | 174/65 R X |
| 2,710,381 | 6/1955 | Monson | 174/51 X |
| 3,009,128 | 11/1961 | De Carlo | 174/51 X |
| 3,206,539 | 9/1965 | Kelly | 174/68.3 |
| 4,145,566 | 3/1979 | Weingartner | 174/65 R |
| 4,151,363 | 4/1979 | Nichols | 174/65 R |
| 4,209,661 | 6/1980 | Pate et al. | 174/65 R |
| 5,513,513 | 5/1996 | Suess et al. | 72/409.18 |
| 5,594,202 | 1/1997 | Tobias | 174/65 R X |

*Primary Examiner*—Kristine Kincaid
*Assistant Examiner*—Chau N. Nguyen
*Attorney, Agent, or Firm*—Robert Halper

[57]  ABSTRACT

A grounding electrode conductor passes through a metallic surface of a panel board and is connected to a bus bar provided in the panel board. The conductor is supported by a press sleeve connector mounted on the panel board. A clamp is used to contact and secure the conductor to the connector. Both the grounding electrode conductor and the connector are in conformance with the 1996 National Electrical Code.

6 Claims, 2 Drawing Sheets

5,912,434

KENNY CLAMP

FIELD OF INVENTION

This invention pertains to a clamp, described as a "Kenny Clamp" whose function it is to bond the grounding electrode conductor to the enclosure of an electric service box, an auxiliary gutter or other related service equipment in accordance with the requirements of the 1996 National Electric Code and is particularly useful in household wiring.

BACKGROUND OF THE INVENTION

Typically the grounding electrode conductor is fastened to a water pipe or made electrode and extends through an outlet in a service box where it is fastened to a bus bar with a screw.

Exemplary pf prior art ground connectors are as follows:

U.S. Pat. No. 2,710,381 teaches a device for bonding an electric ground wire to an electric outlet or switch box. This apparatus employs a grounding coupling or wedge wherein the electric wire to be connected to the box is placed in a groove and a stud screwed down upon it. A pin having contact with the ground wire also makes contact with the electric outlet box.

U.S. Pat. No. 3,009,128 teaches a coupling nut provided with a terminal connector for use in grounding equipment (not specified). The problem that was solved encompassed making the coupling nuts accessible. Heretofore the coupling nut was attached to the terminal in such a way that after it was in place, the terminal connector was inaccessible or very difficult to access. In the invention the coupling nut is cylindrical, has internal threads for threading to a conduit that projects into a service box. A terminal is mounted outside the fitting and has an opening through which a ground wire from equipment within the box can enter either way, and then a set screw is placed down on the wire either radially or axially.

U.S. Pat. 3,567,843 teaches an electric connector for attaching a waterproof jacketed armored cable to a junction box. The cable is rigidly gripped by the connector, which comprises a resilient grommet surrounding the jacket which is compressed between two threaded members. Stirrups straddle the inner and outer surfaces of the grommet at one end and contact both an exposed metal part of the cable and the connector to provide electric grounding. The connector is also provided with a section extending from the gripping surfaces to thread into the junction box.

U.S. Pat. No. 4,496,791 shows a spring biased connector for electrically bonding a device to a supporting wall. A flanged bushing is threaded into a push button housing mounted on a metal wall. A serrated spring is located between the flange of the bushing and the metal wall so that when the threaded fastener engages the bushing the spring is deflected into the wall and completes an electric circuit. This type of arrangement obviates use of a ground connection wire.

U.S. Pat. No. 5,181,860 teaches a plug and receptacle connector that is to be used on the control box of a machine tool, etc. An earth lug when mounted in an insulator causes a spring piece of the lug to pierce into a chromate film on a galvanized layer of a receptacle shell resulting in conductivity.

As can be seen there are a number of ways of making ground connections; however, none of the above cited grounded connections would satisfy the 1996 National Electrical Code, (hereinafter referred to as Code) which stipulates that a grounding electrode conductor entering a panel board, must be bonded to a metallic surface and must be connected to a grounding electrode, for example a metal water pipe or a metal rod driven into earth. None of the devices mentioned in the above cited patents show such an arrangement. U.S. Pat. No. 2,710,381 bonds an electric ground wire to a metallic box but shows no connection to a grounding electrode. Similarly U.S. Pat. No. 3,567,843 shows electrical grounding of metal surface of a cable to an electrical junction box. In 4,496,791 there are features such as the spring jumper that might be likened to a grounding electrode conductor and the conductive wall might be a grounding electrode; however there is an additional element such as the push button considered to be a grounding conductor. Additionally the conductive wall would not satisfy the code as a ground electrode. As defined in the Code, "Grounding Conductor" is a conductor used to connect equipment or the grounded circuit of a wiring system to a grounding electrode or electrodes, that is the push button, mentioned above is the grounding conductor. The "Grounding Electrode Conductor" is the conductor used to connect the grounding electrode to the equipment grounding conductor, to the grounded conductor or to both. The grounding electrode conductor as defined herein provides a low impedance path for service equipment and conductors during fault conditions, short circuits or ground faults. Under normal conditions electricity seeks to return to its source and complete a continuous circuit. This return path is often provided by white neutral wires that return current to the main service panel. A grounding electrode conductor provides an additional return path for electrical current. The ground electrode conductor is a safety feature. As stated above, it is designed to conduct electricity to its source, if current seeks to return to the service panel along a path other than the neutral wire.

Even if the ground wires of the aforesaid patents were to be considered to be grounding electrode conductors they would not satisfy the Code. The fact is that none of the grounding wires is designed to handle an excessive amount of fault current, for example in excess of 10,000 amperes in domestic households, for an extended period of time. This is significant for the reason that if there should be a failure in the circuit and an excessive amount of current is dumped onto this wire, it would be unable to control the situation.

Accordingly it is an object of this invention to provide a grounding electrode conductor to be connected to a panel board that conforms to the 1996 National Electrical Code.

It is another object of this invention to use a grounding electrode conductor that is rated for the available fault current.

It is also another object of this invention to facilitate the securement of the grounding electrode conductor to the panel board by use of a simple clamp.

DETAILED DESCRIPTION OF THE PREFERRED EMBODIMENT

Figure 1:
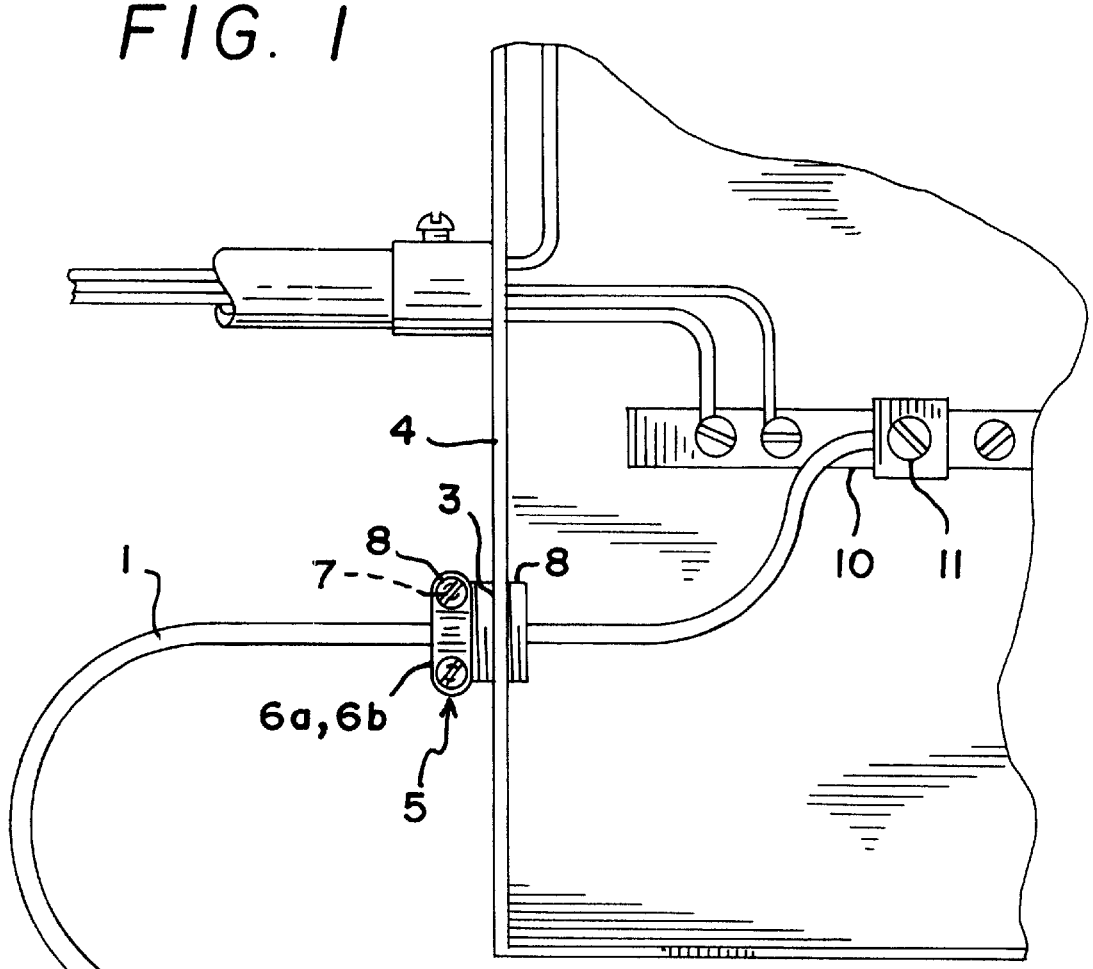
FIG. 1 is a front section showing the assembly of a grounding electrode conductor to a conventional electrical connector in the panel board

FIG. 1 shows the grounding electrode conductor 1 conventionally connected to a water pipe 2, the grounding electrode, and extending to an inlet 3 of a panel board 4. The conventional connector 5 consists of adjacent plates 6a, 6b through which conductor 1 passes. These plates contain spaced threaded perforations 7 through which pass screws 8 to secure the conductor 1 to the plates. One of the plates is welded to a bushing 8a that threads into an opening 9 in the panel board. The conductor 1 terminates in a bus bar 10 where it is secured by screw 11.

Figure 3:
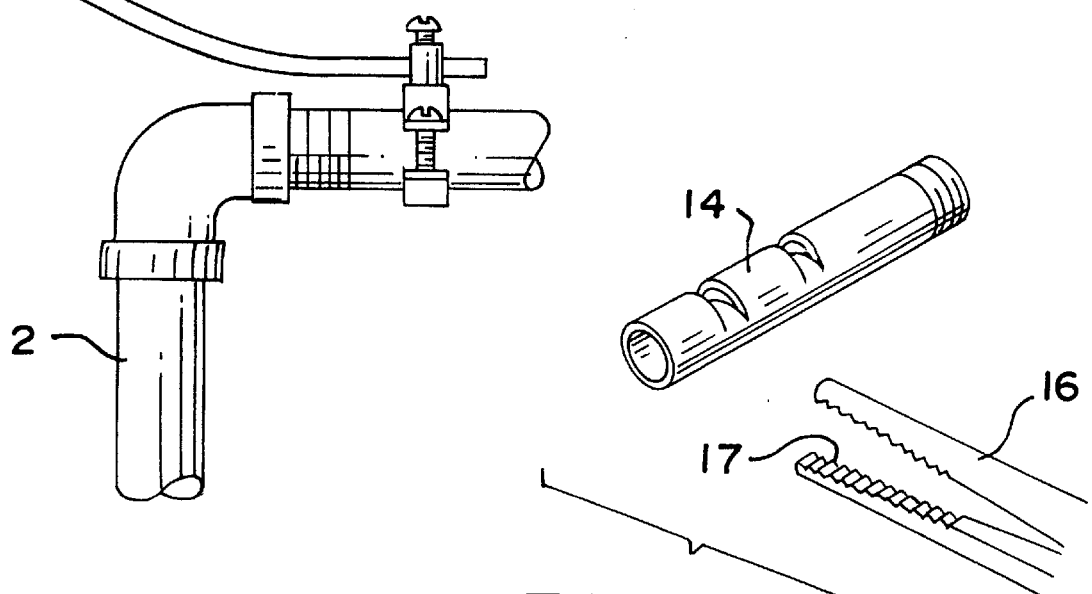
FIG. 3 is an enlarged view of the improved connector and a mechanism for fastening of the connector to the conductor.
Figure 5A:
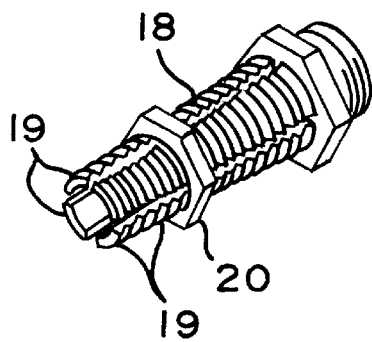
FIG. 5a is an enlarged view of a third embodiment of a connector.
Figure 5B:
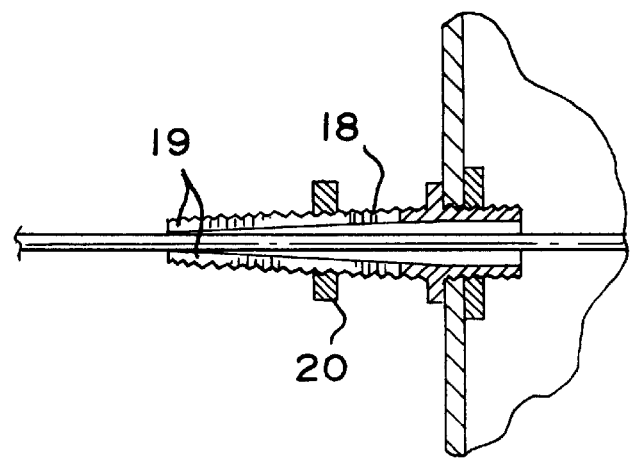
FIG. 5b is a similar view to FIG. 4b showing the third embodiment secured to the panel board.
Figure 4A:
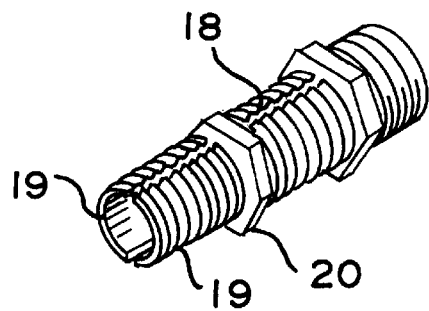
FIG. 4a is an enlarged view of another embodiment showing another connector.
Figure 4B:
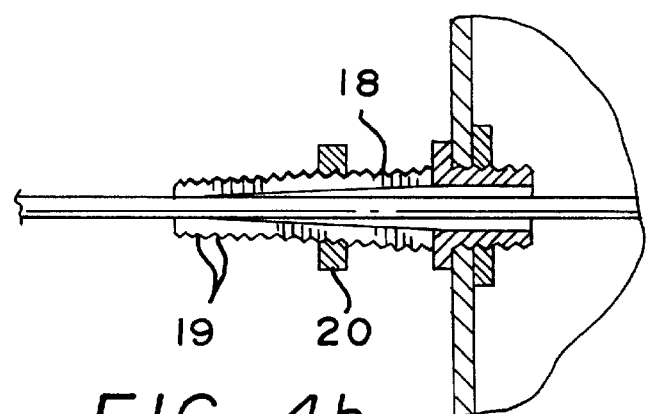
FIG. 4b is a view showing the connector secured to the panel board.
Figure 2:
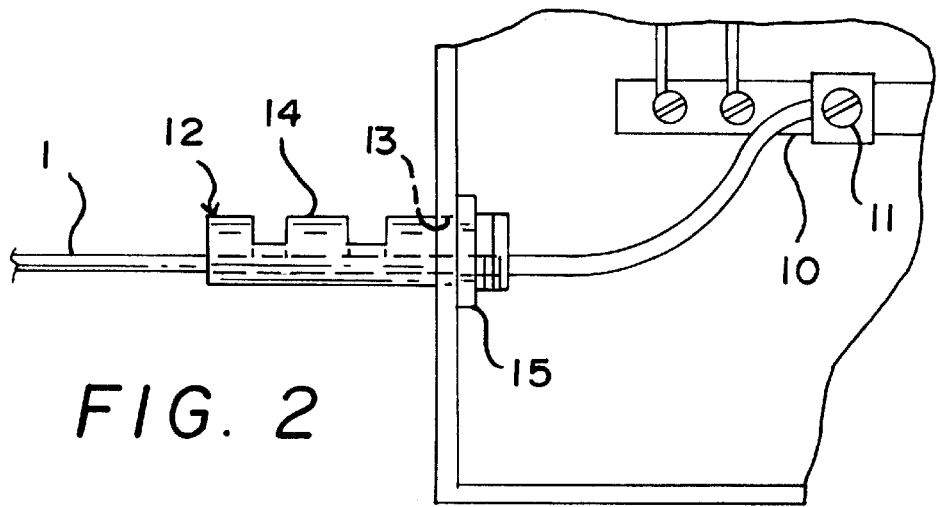
FIG. 2 is a front section showing the assembly of the grounding electrode conductor to the improved electrical connector of the invention in the panel board.

FIG. 2 shows the grounding electrode conductor 1 assembled as in FIG. 1 except for the improved connector 12. The inlet 13 is now of a size to accommodate a high press sleeve 14 which is either ½ or ¾" and is made of copper or aluminum. For a ½" sleeve a #8 through #2 bare copper conductor, or a #6 through #1 bare aluminum would be used. For a ¾" sleeve, a #1 through 3/0 bare copper/aluminum conductor, or a #1 through 4/0 bare aluminum would be used. The portion of the sleeve that enters the panel board is threaded and secured therto by a lock nut 15. The conductor passes through the sleeve and as in FIG. 2 ends in the bus bar 10 within the panel board, where it is secured by the screw 11. The conductor 1 is clamped in the sleeve by crimping the sleeve. As shown in FIG. 3, a long handled plier 16 having arms 16a, wherein one arm has a projecting tooth 17a and the other arm has a corresponding groove 17b. The plier grasps the sleeve at several positions on its outer surface to compress the sleeve around the conductor. A second method shown in FIG. 4 involves shaping the sleeve as a funnel 18 wherein the narrow portion of the funnel is slit into two legs 19 which are threaded the length of the funnel. Beyond the funnel there is a cylindrical threaded extension 20 that is fastened to the panel board and secured by a lock nut 21 adjacent the interior of the panel board. A threaded ring 22, having a diameter corresponding to the diameter of the narrow portion of the funnel, is slipped over the legs. As it is turned upward, it compresses the legs around the conductor. A flange 23 on the extension adjacent the exterior surface of the panel board limits the movement of the ring. While this is the preferred device used to clamp the conductor, a slight modification is shown in FIG. 5a. The narrow portion of the funnel is divided into four legs. This modification is more appropriate where the grounding electrode conductor is of a larger diameter. In any case whichever device is used, both the conductor and sleeve are rated for fault current.

The bonding circuit created between the grounding electrode conductor, its associated clamp and the grounding electrode is superior to any of the assemblies aforementioned including that shown in FIG. 1. Bonding means joining all metal parts of the wiring system such as the panel board or other enclosures. It ensures having good, continuous metallic connections throughout the grounding system. While U.S. Pat. No. 4,496,791 discusses bonding according to the National Electric Code of 1981, the spring member therein that completes the bond is made of carbon steel, whereas the grounding electrode conductor and the associated clamp of this invention is made of aluminum or copper which are the acceptable materials of the National Electric Code of 1996; moreover the connector of U.S. Pat. No. 4,496,791 is for a pushbutton switch and would not be suitable for household wiring or commercial wiring. Similarly the clamp of FIG. 1 is of nondescript material, different than the copper material of the grounding electrode conductor. Thus in the event of a ground fault condition, the grounding electrode conductor could bum off because of the dissimilarity of materials.

While the invention has been shown and described in terms of specific embodiments, it will be obvious to those skilled in the art that various modifcations and changes can be made therein without departing from the scope and spirit of the invention.

I claim:

1. A device for bonding a grounding electrode conductor to the enclosure of an electric service box in conformance to the National Electric Code comprising:

a) a grounding electrode having a grounding electrode conductor affixed thereto, said conductor extending from said grounding electrode to said enclosure, b) said enclosure having an inlet to which a metal press sleeve connector can be affixed, said connector having a top and bottom with an aperture thereat for receiving said conductor, said top of said connector being threaded and secured to said inlet by a lock nut, said conductor having an end that passes through said aperture in said top and being fastened to a bus bar in said enclosure, c) compression means for clamping and securing said grounding electrode conductor to said metal press sleeve in electrical contact at the region of clamping, d) said sleeve being in the form of a funnel having a lower, bifurcated, narrow end and a wider upper end having a cylindrical extension that threads into said inlet said enclosure, said funnel having a threaded exterior surface and said compression means includes a threaded ring having an internal diameter that corresponds to that of said narrow bifurcated end, said ring being rotated so as to compress said bifurcated end of said funnel around said conductor, e) said press sleeve and said grounding electrode conductor being rated for available fault current.

2. A device as in claim 1 wherein said connector and said conductor are made of aluminum.

3. A device as in claim 1 wherein said connector and said conductor are made of copper.

4. A device as in claim 1 wherein said lower end of said funnel is divided into four legs.

5. A device as in claim 1 wherein said connector and said conductor are adapted for a household or commercial wiring system.

6. A device as in claim 1 wherein said sleeve has a diameter of ½" or ¾" and said conductor has a dimension within the range of #8–#2 for a ½" sleeve and within the range of #1–3/0 for a ¾" sleeve.

* * * * *